(12) United States Patent
Roschek et al.

(10) Patent No.: US 7,981,776 B2
(45) Date of Patent: Jul. 19, 2011

(54) METHOD FOR DEPOSITING SILICON

(75) Inventors: Tobias Roschek, Buchs (CH); Bernd Rech, Aachen (DE)

(73) Assignee: Forschungszentrum Julich GmbH, Julich (DE)

( * ) Notice: Subject to any disclaimer, the term of this patent is extended or adjusted under 35 U.S.C. 154(b) by 445 days.

(21) Appl. No.: 10/547,118

(22) PCT Filed: Jan. 20, 2004

(86) PCT No.: PCT/DE2004/000066
§ 371 (c)(1),
(2), (4) Date: May 3, 2006

(87) PCT Pub. No.: WO2004/076713
PCT Pub. Date: Sep. 10, 2004

(65) Prior Publication Data
US 2006/0240649 A1    Oct. 26, 2006

(30) Foreign Application Priority Data
Feb. 27, 2003  (DE) .................................. 103 08 381

(51) Int. Cl.
*H01L 21/00* (2006.01)
(52) U.S. Cl. ................. 438/485; 438/478; 257/E21.297
(58) Field of Classification Search .................. 438/485, 438/478; 257/E21.297
See application file for complete search history.

(56) References Cited

U.S. PATENT DOCUMENTS

| | | | |
|---|---|---|---|
| 5,334,423 A * | 8/1994 | Guha et al. .................. 438/485 |
| 5,824,940 A | 10/1998 | Chediak et al. | |
| 6,380,612 B1 | 4/2002 | Jang et al. ................... 257/649 |
| 6,488,995 B1 * | 12/2002 | Nishimoto et al. ........... 427/574 |
| 6,794,275 B2 * | 9/2004 | Kondo et al. ................ 438/485 |

FOREIGN PATENT DOCUMENTS

JP  2002030438  1/2002

OTHER PUBLICATIONS

Beibericher et al. Gas-efficient deposition of device-quality hydrogenated amorphous silicon using low gas flows and power modilated radio-frequency discharges, J.Va.Sci.Techol.A 21, 2003, pp. 156-166.*
Craf et al."High rate growth of microcrystalline silicon by VHF-GD at high pressure", Thin Solid Films 427 (2003) 37-40.*
Klein et al. "Microcrystalline Silicon Prepared by Hot-Wire Chemical Vapour Deposition for Thin Film Solar Cell Applications.", Jpn. J.Appl.Phys. vol. 41, 2002, pp. L10-L12.*
New Materials and Deposition . . . by B. Rech et al. (Solar Energy Materials 74 (2002).
Development of a Si:Hμc-Si:H Thin Film . . . by W. Psyk et al. (EP Solar Energy Conference, Oct. 2001).

(Continued)

*Primary Examiner* — Asok K Sarkar
*Assistant Examiner* — Julia Slutsker
(74) *Attorney, Agent, or Firm* — Jonathan Myers; Andrew Wilford

(57) ABSTRACT

The inventive method for depositing silicon onto a substrate firstly involves the introduction of a reactive silicon-containing gas and hydrogen into the plasma chamber and then the initiation of the plasma. After initiating the plasma, only reactive silicon-containing gas or a gas mixture containing hydrogen is supplied to the plasma chamber in an alternatively continuous manner, and the gas mixture located inside the chamber is, at least in part, simultaneously withdrawn from the chamber. From the start, homogeneous microcrystalline silicon is deposited onto the substrate in the presence of hydrogen.

16 Claims, 2 Drawing Sheets

OTHER PUBLICATIONS

Amorphous and Microcrystalline Silicon Solar Cells..bY b. rech et al. (sOLAR eNERGY rnATERIALS, 66 (2001).

Mycrocrystalline N-I-P solar cells . . . by I. Feitknecht et al. (Solar Energy Materials 66 (2001).

VHF Plasma Deposition . . . by X. Deng et al. (Mat. Res. Soc. Symp. vol. 467, 1997).

Novel Profdiled Thin-Film Polycrystalline . . . Schropp et al. (IEEE Transactions, Oct. 1999.

Plasma Deposition of Thin Film Silicon: . . . by L. Feitknecht et al. (Solar Energy Materials 74 (2002).

* cited by examiner

METHOD FOR DEPOSITING SILICON

CROSS REFERENCE TO RELATED APPLICATIONS

This application is the US national phase of PCT application PCT/DE2004/000066, filed 20 Jan. 2004, published 10 Sep. 2007 as WO 2004/076713, and claiming the priority of German patent application 10308381.2 itself filed 27 Feb. 2003, whose entire disclosures are herewith incorporated by reference.

FIELD OF THE INVENTION

The invention relates to a method for depositing silicon coatings and especially to a method of depositing microcrystalline silicon in which only a small amount of hydrogen is required.

STATE OF THE ART

Microcrystalline silicon is a material which is used especially in solar cells as an absorber material. It is produced is today in many laboratories by means of the PECVD (plasma enhanced chemical vapor deposition) from a silane and hydrogen. The supply of hydrogen, the so-called hydrogen dilution, is here necessary to produce crystalline silicon at substrate temperatures below 500° C. These crystalline silicon coatings are comprised of many microscopically small crystallites and thus the name "microcrystalline silicon."

Microcrystalline silicon can be deposited in various deposition regimens as high value coatings. In the deposition with PECVD using the standard industrial frequency 13.56 MHz the silane concentration (=silane flow/hydrogen flow) is typically about 1% and at excitation frequencies in the VHF range is as a rule less than 10%. The hydrogen is required in order to influence growth of the coating. However, only a small part of the hydrogen used is incorporated in the silicon layer to be produced, typically less than 10%. The remaining hydrogen is pumped off. For a later industrial production, the high hydrogen consumption, especially for deposition at 13.56 MHz is a significant problem because of its high cost[1].

From the state of the art, the following important methods of depositing microcrystalline silicon by PECVD with reduced hydrogen consumption are known.

1. The "Closed-Chamber CVD Process" (CC-CVD)[2]:

This investigated process runs cyclically (discontinuously) and encompasses basically two process steps. In a first step a small amount of the reactive process gas ($SiH_4$ or $CH_4/SiH_4$ mixture) flows in a ratio of about 25% reactive gas to hydrogen through the chamber. This step serves to refresh the gas atmosphere after a process cycle. During this time the plasma burns with reduced power (about 10 W) so that an ultrathin silicon layer is deposited.

In the subsequent second step, both the pump power from the chamber and also the gas supply into the chamber are interrupted. By delaying the shutoff of the hydrogen feed, the deposition pressure is increased and the silane concentration lowered to about 5%. The plasma burns for about 60 watts more. The process gas is gradually decomposed and the deposited layer grows further.

At the same time a contrary effect arises. The coating is etched by hydrogen radicals. The etch rate increases continuously because of the increasing proportion of hydrogen in the plasma until finally an equilibrium between the coating growth rate and the etching is reached. Atoms which are the most weakly bound are preferably etched so that finally a network of strongly bound material is formed.

The entire deposition process is carried out as a continuous repetition of these two steps in succession (layer by layer) until the desired coating thickness is achieved. The volume proportion of crystallites is greater than 90%. Because of the cyclical variation in the process conditions, this process is however very expensive. It differs basically from the standard PECVD process used and has until now not been found to be suitable in industry. With this process up to now, it also has not been possible to make solar cells.

2. The "Static Closed Chamber Process" (VHFGD)[3]:

This very high frequency glow discharge (VHFGD) deposition process is a continuous process without continuous input of hydrogen. The deposition chamber (plasma chamber) is not completely isolated. A small flow of silane is admitted into the chamber and a corresponding amount of gas is simultaneously pumped off. The deposition is effected with VHF excitation and at reduced pressure (0.1 mbar). In the deposition of silicon from the silane, hydrogen is liberated. The reduced silane gas flow ensures that a silane-poor state develops. The initial rapid deposition of silicon is braked by the increase in dissociated hydrogen. After about one minute, static conditions prevail with a small ratio of $[SiH^*]/[H_\alpha]$ at which a continuous microcrystalline growth is possible.

Since the deposition is started with a pure silane plasma and only later does hydrogen arrive from the decomposition of the silane, the deposited layer has a significant amorphous incubation layer (about 100 Å) as a first layer. This can result in a significant detriment to the function in the use of such coatings in electronic components, especially in solar cells. Thus solar cells whose i-layer is made by this process only have an efficiency of 2.5%.

OBJECT OF THE INVENTION

The object of the invention is to provide a method of making microcrystalline silicon coatings which on the one hand have a substantially homogeneous microcrystalline structure in the direction of coating growth, that is structurally homogeneous characteristics and on the other hand use only small amounts of hydrogen.

SUMMARY OF THE INVENTION

This object is achieved by a method of making microcrystalline silicon coatings as described in more detail below.

The formation of homogeneous microcrystalline silicon coatings, especially as a first layer on a substrate, can be effected in a plasma deposition chamber only in the presence of corresponding amounts of hydrogen.

This means that already at the beginning of a deposition, hydrogen must be provided for a crystalline growth to be effected advantageously from the start. In the framework of the invention, a process has been developed whereby overall there will be a small hydrogen consumption But nevertheless sufficient oxygen will be made available from the beginning of the deposition. In a continuous process, advantageously only small amounts of hydrogen are introduced. Advantageously, during the deposition process steady static (steady-state) deposition conditions are established. This is accomplished, among other things by a controlled feed and discharge of the corresponding gases into and from the plasma chamber. At the beginning of the deposition process, the ratio of the reactive silicon-containing gas to hydrogen of less than 0.5 and especially of less than 0.25 has been found to be effective. As the reactive silicon-containing gas for this process, especially silanes can be mentioned. Higher silanes, for example disilane, ($Si_2H_6$) chlorosilane and fluorosilanes, for example $SiCl_4$ or $SiF_4$, as well as their higher forms and mixed forms, for example, dichlorosilane ($SiCl_2H_2$) are also conceivable. The excitation frequency for the plasma should advantageously be smaller than 50 MHz, especially smaller than 30 MHz. When the deposition is carried out with PECVD, for example, a standard industrial frequency of 13.56 MHz is used.

A first embodiment of the invention provides initially a mixture of hydrogen and a reactive silicon-containing gas, especially silane, at the starting conditions within the deposition chamber. This can be achieved for example either by a) the continuous traversal of the plasma chamber by a corresponding gas mixture of silane and hydrogen, or however also b) by a one-time flooding of the previously evacuated plasma chamber with a gas mixture.

Simultaneously with the starting up of the plasma, in case a) the hydrogen feed is terminated.

In a further part of the process, after the plasma start up has occurred, the silane in the chamber is disassociated by the plasma and consumed in the deposition process and thus is replaced by the continuous feed of the silane to the chamber. To maintain static [steady-state] pressure conditions (deposition pressure) within the plasma chamber. A corresponding amount to the gas mixture fed must be removed from the chamber. In the presence of hydrogen there is a microcrystalline growth of the silicon coating on the substrate from the start.

Since the absolute gas flux which is adjusted will depend on the respective size of the plasma chamber the gas flow in accordance with the invention is set depending upon the substrate area to be coated. The gas flow after the start up of the plasma of the reactive silicon-containing gas lies advantageously in the range between 0.5 and 20 [standard cubic centimeters] sccm/100 $cm^2$ of coating area and is especially in the range between 0.5 and 5 sccm/100 $cm^2$ of coated area.

In an alternative mode of the method, the plasma chamber containing the substrate is supplied continuously with a mixture of reactive silicon-containing gas and hydrogen. The plasma is started and the desired microcrystalline deposition is effected upon the substrate. Here as well, static [steady state] pressure conditions within the chamber are maintained so that a corresponding amount of the gas mixture supplied is discharged from the chamber.

Advantageously, both the total gas flow and also the ratio of reactive silicon-containing gas to hydrogen are maintained constant during the entire deposition. Typical total flows can be in the range below 20 standard sccm/100 $cm^2$ of coated area, especially in the range below 6 sccm/100 $cm^2$ of coated area. The ratio used of reactive silicon-containing gas and hydrogen then lies preferably in the range above 15%, especially above 19% (it is theoretically conceivable also that a start up can occur with a pure $H_2$-plasma). It has been found to be especially advantageous to provide a total gas flow which is less than 10 sccm/100 $cm^2$ of coating area with a deposition rate>1 Å/s and of less than 50 sccm/100 $cm^2$ of coated area with a deposition rate> greater than 5 Å/s, less than 60 sccm/100 $cm^2$ of coated area and a deposition rate greater than 10 Å/s, and of less than 200 sccm/100 $cm^2$ of coated area at a deposition rate greater than 20 Å/s.

Especially good results are obtained with a total gas flow of less than 6 sccm/100 $cm^2$ of coating area with a deposition rate of >1 Å, with a total gas flow of less than 30 sccm/100 $cm^2$ of coating area with a deposition rate of >5 Å/s, with a total gas flow of less than 60 sccm/100 $cm^2$ of coating area with a deposition rate of >10 Å/s, and with a total gas flow of less than 120 sccm/100 $cm^2$ of coating area with a deposition rate of >20 Å/s.

It has been found to be advantageous to select a silicon concentration above 3% at an excitation frequency of 13.56 MHz and especially above 10% for all greater excitation frequencies of the plasma.

The method according to the invention enables in a simple manner the application of homogeneous crystalline silicon coating which especially have been found to be highly suitable for use as absorber layers in a solar cells.

It has been found to be especially advantageous because the process can be carried out in the narrow process window which is required for solar cells with high efficiency for suitable coatings.

BRIEF DESCRIPTION OF THE DRAWING

In the following the subject matter of the invention will be described with reference to three figures as well as two embodiments in greater detail, without limiting the scope of the invention thereto. In the drawing.

The solar cells were produced at a deposition pressure $P_{dep}$=11 mbar and a plasma energy of $P_{HF}$=0.26 W/$cm^2$ and had an absorber layer thickness of about 1.1 µm (according to Repmann[4]).

Figure 1:
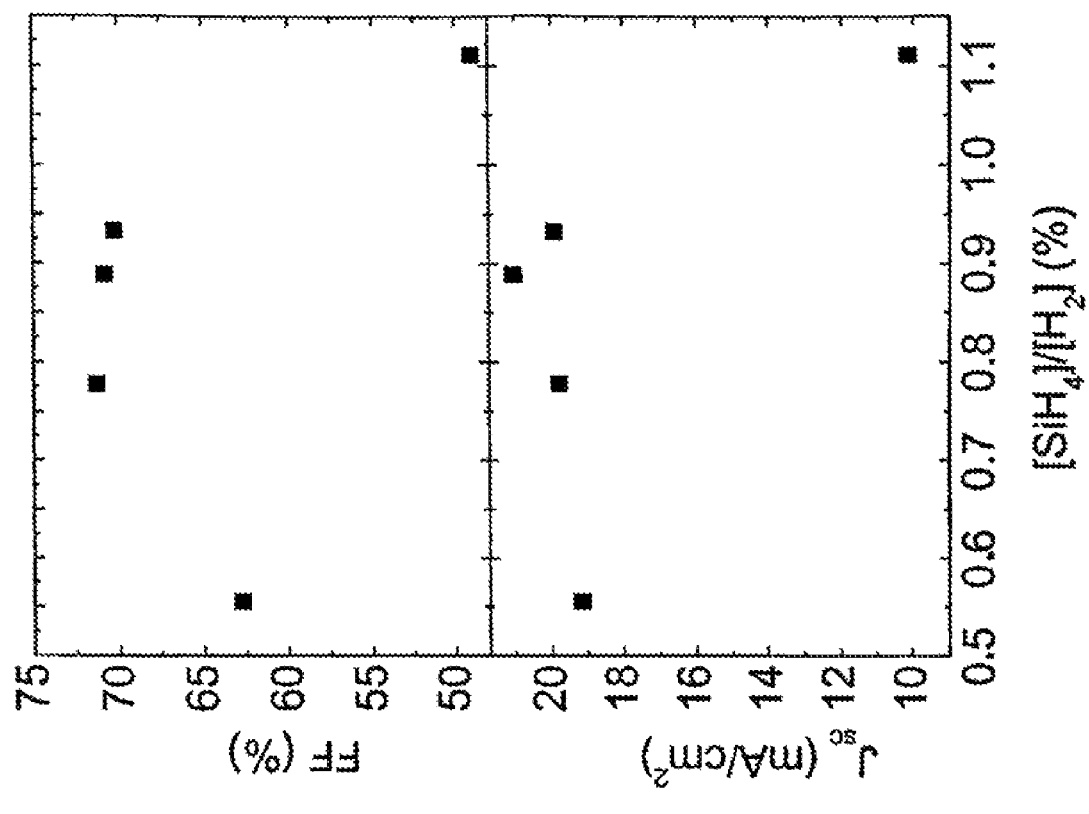
FIG. 1 shows the solar cell characteristic values
a) efficiency
b) filling factor FF,
c) no load (open circuit voltage $V_{oc}$) and
d) short circuit current density $J_{SC}$, all as a function of the silicon concentration $[SiH_4]/[H_2]$.
Figure 1:
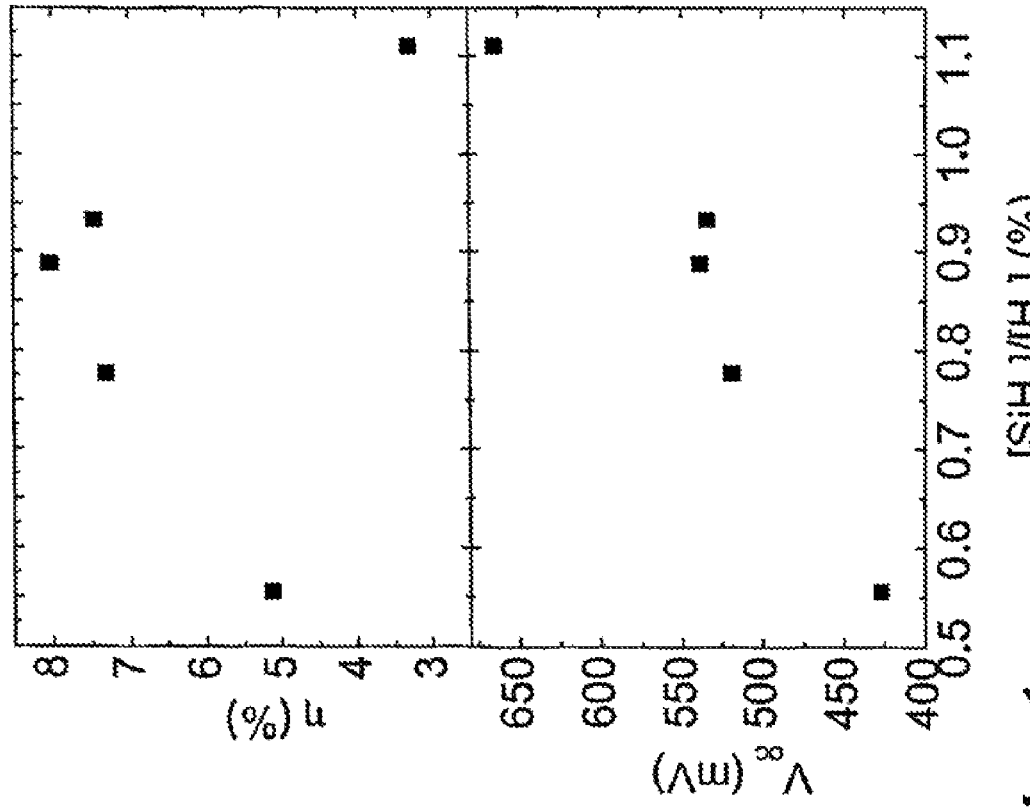
Figure 2:
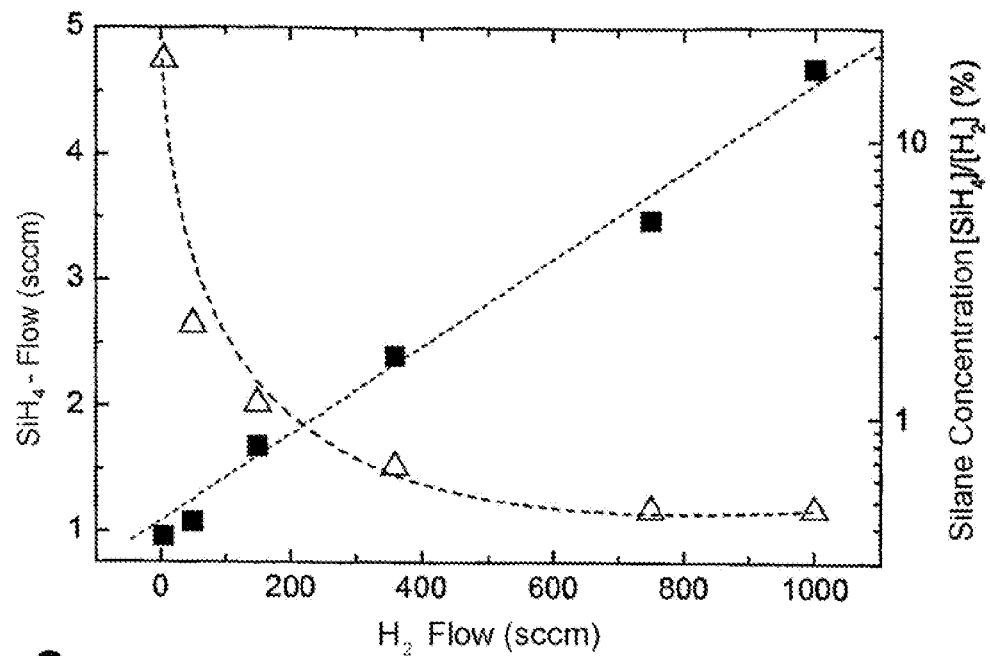

FIG. 2 illustrate silane flow (squares) and silane concentration (open triangles) for the fuel cells with optimized fabrication (corresponding to FIG. 1) at different hydrogen fluxes. The solar cells were coated at 27 mbar and 0.7 W/$cm^2$ with the absorber layers.

Figure 3:
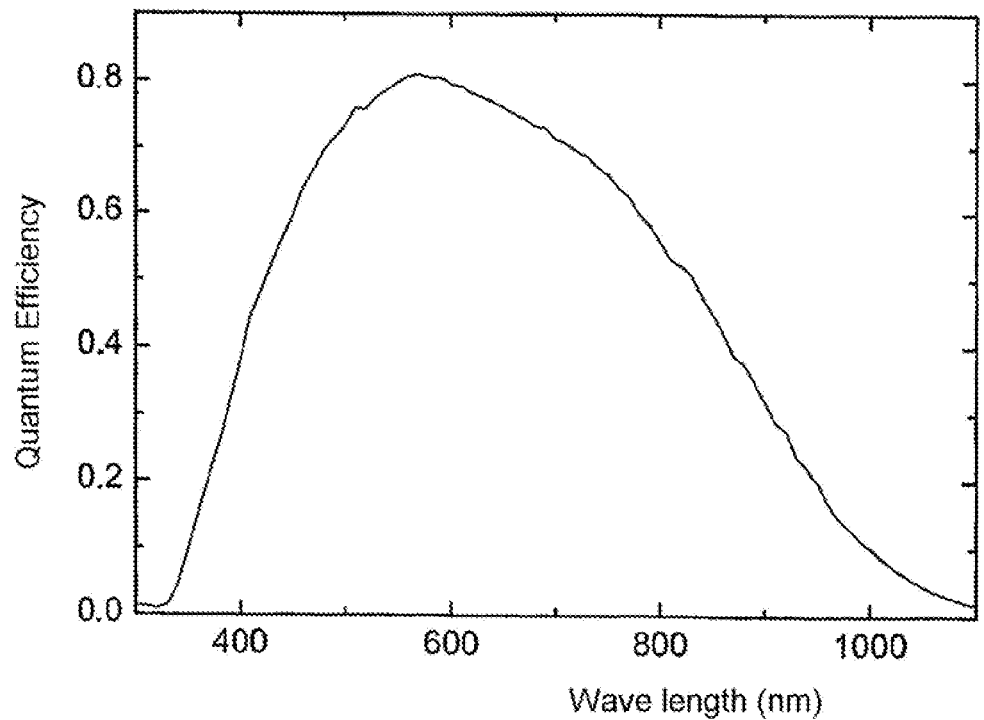

FIG. 3 shows the quantum efficiency of a solar cell with 7.3% efficiency with an i-layer produced without feed of hydrogen (Example A).

SPECIFIC DESCRIPTION

FIG. 1 describes the relationship of the solar cell parameters with variation of the silane concentration during the i-layer growth (absorber at a certain silane concentration here about 0.9%) a maximum efficiency is obtained. This silane concentration is not only of significance for solar cells but is also the high silane concentration at which under the given conditions microcrystalline silicon can be produced with a high volume proportion.

In FIG. 2 the maximum silane flow for a given hydrogen flow in a continuous process for microcrystalline growth and the resulting silane concentrations have been given. The optimization is effected in accordance with FIG. 1. With these concentrations of silane flow and hydrogen flow at the indicated pressures and powers the respective homogeneous growths of microcrystalline silicon coatings (at high volume proportion of crystals) is possible.

FIG. 3 shows the quantum efficiency of a solar cell in which during the deposition hydrogen was no longer supplied the higher quantum efficiencies are indicated in the long wave (>800 nm) portion of the spectral range) showing that the i-layer has a high crystalline volume proportion.

In the following, two embodiments of the process of the invention are described in greater detail.

Both embodiments relate to a respective substrate area of 100 cm².

A) In a first embodiment of the process a mixture of hydrogen and silane (in accordance with standard conditions, that is a silane-hydrogen mixture according to FIG. 2 is introduced in order to ensure defined starting conditions before the commencement of the deposition.

Since at the start hydrogen is provided, the microcrystalline growth begins at the outset. After the start of the plasma the hydrogen flow is shut off. The consumed silane is replaced by a slight influx of silane. Hydrogen is present for the entire time since on the one hand the hydrogen present at the beginning in the chamber is only consumed to a small degree and is only partly pumped off and on the other hand during the deposition of silicon from the silane new hydrogen is continuously released ($SiH_4 \rightarrow Si(coating) + 2H_2$). The exhaust pumping is so controlled over the entire period that the deposition pressure remains constant. An optimization of the process is effected through the choice of suitable starting conditions and through the choice of the silane flow during the deposition.

The process is thus comprised of two steps:
1. The establishment of the deposition pressure with high hydrogen flow and reduced silane flow (without plasma).
2. The deposition under an influx exclusively of silane. In the selected embodiment or example, at p=27 mbar, a gas mixture with the ratio $[SiH_4]/[H_2]$ of 2.4 sccm/360 sccm was admitted into the chamber. With the starting of the plasma (13.56 MHz plasma) the supply of hydrogen was stopped. The silane flow established after the start of the plasma was 1 sccm. The silicon was deposited upon the substrate at a power of 0.7 W/cm². The thickness of the coating deposited amounted to 1.8 µm with a deposition rate of 1.7 Å/s.

The microcrystalline layer made by this process was completely incorporated in a solar cell. The thus fabricated solar cell had an efficiency of 7.3% (FF=62.6%, $V_{oc}$=490 mV, $J_{SC}$=23.9 mA/cm²). In FIG. 3 the quantum efficiency of the fabricated solar cell has been given. The high short circuit and the high quantum efficiency for wavelengths greater than 800 mm are an indication of the high volume proportion of crystallinity over the entire i-coating thickness. If the ratio of the consumed silane to the hydrogen used to build hold up the pressure is of interest for this cell, one obtains a ratio of 4:3.

B) In a further embodiment of the process a mixture of silane and hydrogen as process gas was continuously used. At extremely low total gas flow the porosity of silane that results leads to a microcrystalline growth also at low hydrogen flow rates.

In the selected embodiment the solar cell was produced with deposition conditions 1 sccm $SiH_4$, 4 sccm $H_2$, 27 mbar, 0.7 W/cm². The solar cell had an efficiency of 7.0% (FF=69.1%, $V_{oc}$=485 mV, 21.0 mA/cm² at a deposition rate of 2.4 Å/s.

The cited literature in this application:
[1] A. V. Shah et al, Solar Energy Materials and Solar Cells, in print (2003).
[2] S. Koynov et al, Thin Solid Films 383 (2001) 206-208. S. Koynov et al, Jpn. J. Appl. Phys. 33 (1994) pp. 4534-4539.
[3] L. Feitknecht et al, Solar Energy Materials and Solar Cells, 74 (2002) pp. 539-545.
[4] T. Repmann et al, Proc. Of the 28th IEEE Photovoltaic Specialists Conf., pp. 912-915 (2000).

The invention claimed is:
1. A method of depositing an i layer of microcrystalline silicon on a substrate in a plasma chamber, the method comprising the steps of sequentially:
(a) filling the plasma chamber with a reactive silicon-containing gas and hydrogen;
(b) starting a plasma in the chamber;
(c) depositing an i layer of homogeneous microcrystalline silicon on the substrate by continuously supplying the chamber only with a reactive silicon-containing gas or with a mixture of a reactive silicon-containing gas and hydrogen in which the concentration of the reactive silicon-containing gas is set at more than 3% while simultaneously withdrawing at least part of gas from the chamber such that a total flow of gases introduced into the plasma chamber with reference to a surface of the substrate to be coated does not exceed a value of 1 (sccm*s/(cm²*nm)) relative to a silicon deposition rate; and
(d) exciting the plasma at a frequency of less than 50 MHz and establishing a deposition pressure greater than 3 mbar.

2. The method defined in claim 1, further comprising the step of:
(e) regulating a flow of gas into and out of the chamber such a way that a constant deposition pressure is created therein.

3. The method defined in claim 1 wherein the silicon-containing gas and the hydrogen are in a ratio less than 0.5 before the plasma is started.

4. The method defined in claim 1 wherein silane is used as a reactive silicon-containing gas.

5. The method defined in claim 1 wherein the chamber is supplied continuously and exclusively with a reactive silicon-containing gas after the plasma start in a volume flow of 0.5 sccm to 20 sccm/100 cm² covering surface.

6. A method of depositing an i layer of microcrystalline silicon on a substrate in a plasma chamber, the method comprising the steps of sequentially:
(a) filling the plasma chamber with pure hydrogen;
(b) starting a plasma in the chamber;
(c) depositing an i layer of homogeneous microcrystalline silicon on the substrate by continuously supplying the chamber only with a reactive silicon-containing gas or with a mixture of a reactive silicon-containing gas and hydrogen in which the concentration of the reactive silicon-containing gas is set at more than 3% while simultaneously withdrawing at least part of gas from the chamber such that a total flow of gases introduced into the plasma chamber with reference to a surface of the substrate to be coated does not exceed a value of 1 (sccm*s/(cm²*nm) relative to a silicon deposition rate; and
(d) exciting the plasma at a frequency of less than 50 MHz and establishing a deposition pressure greater than 3 mbar.

7. A method of depositing an i layer of microcrystalline silicon on a substrate in a plasma chamber, the method comprising the steps of sequentially:
(a) starting a plasma in the chamber;
(b) depositing an i layer of homogeneous microcrystalline silicon on the substrate by continuously supplying the chamber only with a reactive silicon-containing gas or with a mixture of a reactive silicon-containing gas and hydrogen in which the concentration of the reactive silicon-containing gas is set at more than 3% while simultaneously withdrawing at least part of gas from the chamber such that a total flow of gases introduced into the plasma chamber with reference to a surface of the substrate to be coated does not exceed a value of 1(sccm*s/(cm$^2$*nm)) relative to a silicon deposition rate; and (c) exciting the plasma at a frequency of less than 50 MHz and establishing a deposition pressure greater than 3 mbar.

8. The method defined in claim 1 wherein the silicon deposition rate is >1.0 Å/s.

9. The method defined in claim 8 wherein the silicon deposition rate is 1.7 Å/s.

10. The method defined in claim 6 wherein the silicon deposition rate is >1.0 Å/s.

11. The method defined in claim 10 wherein the silicon deposition rate is 1.7 Å/s.

12. The method defined in claim 7 wherein the silicon deposition rate is >1.0 Å/s.

13. The method defined in claim 12 wherein the silicon deposition rate is 1.7 Å/s.

14. The method defined in claim 1 wherein according to step (c) the concentration of the reactive silicon-containing gas is set at more than 5%.

15. The method defined in claim 6 wherein according to step (c) the concentration of the reactive silicon-containing gas is set at more than 5%.

16. The method defined in claim 7 wherein according to step (b) the concentration of the reactive silicon-containing gas is set at more than 5%.

* * * * *